(12) United States Patent
Nakagawa et al.

(10) Patent No.: US 11,405,572 B2
(45) Date of Patent: Aug. 2, 2022

(54) SOLID STATE IMAGING ELEMENT, ELECTRONIC APPARATUS, AND POWER NOISE CORRECTION METHOD

(71) Applicant: Sony Semiconductor Solutions Corporation, Kanagawa (JP)

(72) Inventors: Daisuke Nakagawa, Kanagawa (JP); Shinichirou Etou, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/270,995

(22) PCT Filed: Sep. 3, 2019

(86) PCT No.: PCT/JP2019/034530
§ 371 (c)(1),
(2) Date: Feb. 24, 2021

(87) PCT Pub. No.: WO2020/054499
PCT Pub. Date: Mar. 19, 2020

(65) Prior Publication Data
US 2021/0329190 A1    Oct. 21, 2021

(30) Foreign Application Priority Data

Sep. 13, 2018 (JP) .............................. JP2018-171806
Nov. 8, 2018 (JP) .............................. JP2018-210704

(51) Int. Cl.
*H04N 5/3745* (2011.01)
*H04N 5/357* (2011.01)
(Continued)

(52) U.S. Cl.
CPC ........ *H04N 5/37455* (2013.01); *H03M 1/462* (2013.01); *H04N 5/357* (2013.01); *H04N 5/3698* (2013.01); *H04N 5/37457* (2013.01)

(58) Field of Classification Search
CPC ................. H04N 5/378; H04N 5/3355; H04N 5/3745–37455; H03M 1/00–645
(Continued)

(56) References Cited

U.S. PATENT DOCUMENTS

2011/0215956 A1\* 9/2011 Ishikawa ................. H03M 1/00
                                                      341/110
2018/0234649 A1  8/2018 Matsuura et al.
(Continued)

FOREIGN PATENT DOCUMENTS

JP      2013-126015 A    6/2013
JP      2016-39586 A     3/2016
(Continued)

OTHER PUBLICATIONS

International Search Report (PCT/ISA/210), International Application No. PCT/JP2019/034530, dated Nov. 22, 2019.
(Continued)

*Primary Examiner* — Xi Wang
(74) *Attorney, Agent, or Firm* — Michael Best & Friedrich LLP

(57) ABSTRACT

A solid state imaging element (100) includes: a successive approximation type analog-digital conversion circuit (140) converting an analog pixel signal received from a pixel of a pixel array portion (110) to a digital code; and a first noise detection circuit (130-1) connected to a DAC (Digital to Analog Converter) output node inside the successive approximation type analog-digital conversion circuit (140) and detecting power noise supplied to the pixel of the pixel array portion (110) to output a detection result to the DAC.

15 Claims, 9 Drawing Sheets

(51) Int. Cl.
  *H04N 5/369* (2011.01)
  *H03M 1/46* (2006.01)
(58) Field of Classification Search
  USPC .................................................. 341/155–172
  See application file for complete search history.

(56) References Cited

U.S. PATENT DOCUMENTS

| | | | |
|---|---|---|---|
| 2018/0295301 A1* | 10/2018 | Lee | H04N 5/3454 |
| 2018/0324373 A1* | 11/2018 | Kim | H04N 5/369 |
| 2019/0068902 A1 | 2/2019 | Nishino et al. | |
| 2019/0082132 A1* | 3/2019 | Thompson et al. | |
| 2019/0166325 A1* | 5/2019 | Kim | H03M 1/468 |

FOREIGN PATENT DOCUMENTS

| | | |
|---|---|---|
| WO | 2017/030007 A1 | 2/2017 |
| WO | 2017/159394 A1 | 9/2017 |

OTHER PUBLICATIONS

Notification of Transmittal of the International Search Report and the Written Opinion of the International Searching Authority, or the Declaration (PCT/ISA/220), International Application No. PCT/JP2019/034530, dated Dec. 3, 2019.

\* cited by examiner

SOLID STATE IMAGING ELEMENT, ELECTRONIC APPARATUS, AND POWER NOISE CORRECTION METHOD

FIELD

The present disclosure relates to a solid state imaging element, an electronic apparatus, and a power noise correction method.

BACKGROUND

An electronic device such as an imaging device processing an analog signal after converting it to a digital signal is provided with an analog-digital conversion circuit for converting an analog signal to a digital signal. In particular, an SARADC (Successive Approximation Register Analog to Digital Converter) is widely used as an analog-digital conversion circuit of small power consumption and size.

For example, Patent Literature 1 discloses an analog-digital conversion circuit improved in terms of AD conversion accuracy through suppression of fluctuation in input offset voltage.

CITATION LIST

Patent Literature

Patent Literature 1: Japanese Patent Application Laid-open No. 2016-39586

SUMMARY

Technical Problem

However, in the abovementioned prior-art technique, there is the possibility of an error being generated in the output from a comparator due to the influence of noise such as fluctuation in pixel power output supplied to a pixel array. In view of this, regarding the SARADC, there is a demand for a technique capable of mitigating the influence of the noise of the pixel power output.

Thus, the present disclosure proposes a solid state imaging element, an electronic apparatus, and a power noise correction method capable of making up for the influence of power noise on an analog-digital conversion result.

Solution to Problem

To solve the problem described above, a solid state imaging element according to the present disclosure includes a successive approximation type analog-digital conversion circuit converting an analog pixel signal received from a pixel of a pixel array portion to a digital code; and a first noise detection circuit connected to a DAC (Digital to Analog Converter) output node inside the successive approximation type analog-digital conversion circuit and detecting power noise supplied to the pixel of the pixel array portion to output a detection result to the DAC.

DESCRIPTION OF EMBODIMENTS

Figure 1:
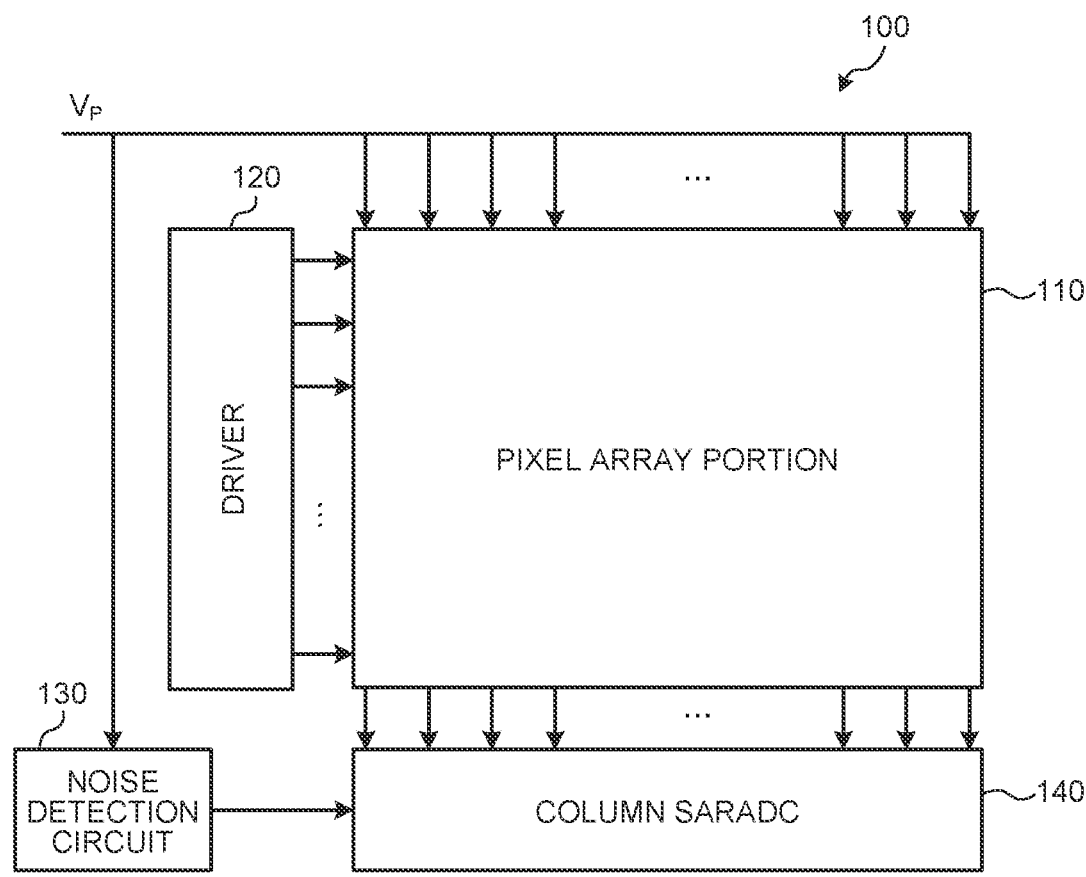
FIG. 1 is a block diagram illustrating an example of the structure of a solid state imaging element according to a first embodiment of the present disclosure.

In the following, embodiments of the present disclosure will be described in detail with reference to the drawings. In the following embodiments, the same portions are indicated by the same reference numerals, and a redundant description thereof will be omitted.

The present disclosure will be described in the order of the following items.

1. First Embodiment
1-1. Structure of Solid State Imaging Element
1-2. Connection Relation between Components
1-3. Structure of SARADC
1-4. Structure of Analog-Digital Conversion Circuit according to First Embodiment
2. Second Embodiment
2-1. Structure of Analog-Digital Conversion Circuit according to Second Embodiment
3. Indirect ToF Type Image Sensor
3-1. Structure of Indirect ToF Type Image Sensor
3-2. Pixel Structure (1. First Embodiment)
[Structure of Solid State Imaging Element]

The structure of a solid state imaging element according to an embodiment of the present disclosure will be described with reference to FIG. 1. FIG. 1 is a block diagram illustrating an example of the structure of a solid state imaging element according to an embodiment of the present disclosure.

As shown in FIG. 1, a solid state imaging element 100 includes a pixel array portion 110, a driver 120, a noise detection circuit 130, and a column SARADC 140.

The pixel array portion 110 has a plurality of pixels (not shown) arranged in a two-dimensional lattice-like fashion. Each of the pixels generates an analog pixel signal through photoelectric conversion of received light. Each of the pixels outputs the generated pixel signal to the column SARADC 140.

Figure 2:
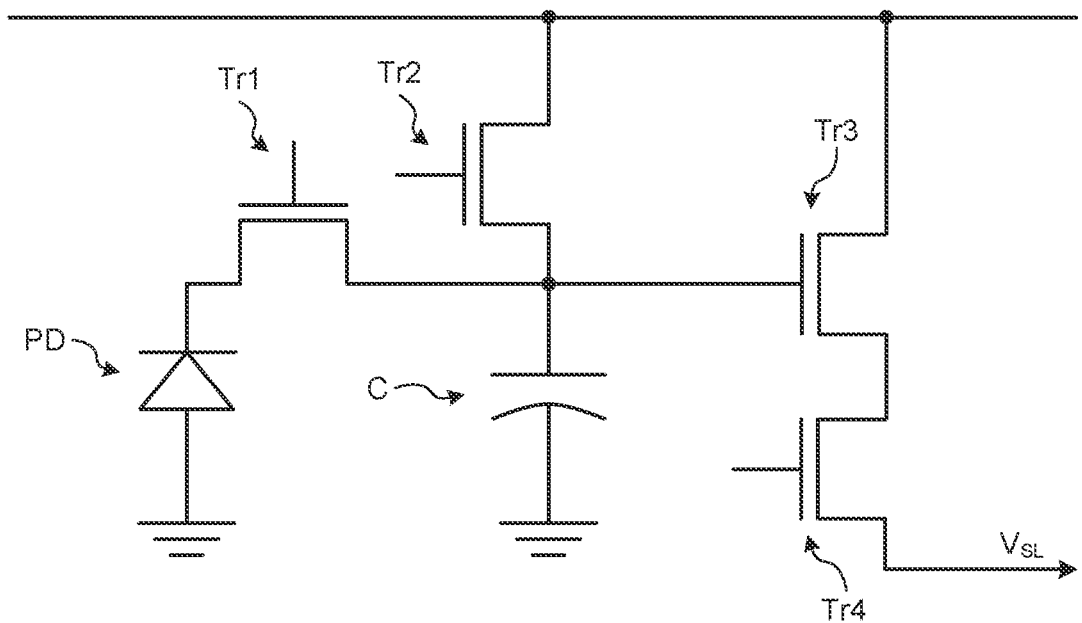
FIG. 2 is a block diagram illustrating an example of the structure of a pixel circuit of the solid state imaging element according to the first embodiment of the present disclosure.

FIG. 2 is a diagram illustrating an example of the pixel circuit structure. As shown in FIG. 2, each pixel arranged in the pixel array portion 110 has a photo diode PD, which is a photoelectric conversion element, and a plurality of pixel transistors (MOS (Metal Oxide Semiconductor) transistors) Tr.

The photo diode PD generates pixel charge through photoelectric conversion of the received light.

As the pixel transistors, the pixel has four MOS transistors: a transfer transistor Tr1, a reset transistor Tr2, an amplification transistor Tr3, and a selection transistor Tr4.

The transfer transistor Tr1 transfers the signal charge generated by the photo diode PD to a capacitor C. The capacitor C accumulates the signal charge transferred from the transfer transistor Tr1, and generates voltage in an amount in accordance with the amount of accumulated charge.

The reset transistor Tr2 is a transistor resetting the amount of charge accumulated in the capacitor C and initializing the amount. The amplification transistor Tr3 is a transistor amplifying the voltage of the capacitor C for current conversion. The selection transistor Tr4 outputs the amplified signal to the column SARADC 140 as a pixel signal.

The driver 120 drives, successively row by row, the pixels arranged in the pixel array portion 110 in a two-dimensional lattice-like fashion to output a pixel signal to the column SARADC 140. That is, in accordance with the control by the driver 120, the pixels output a pixel signal $V_{SL}$ to the column SARADC 140.

The noise detection circuit 130 detects noise contained in pixel power $V_P$ supplied to the pixel array portion 110. The noise detection circuit 130 feeds the detected noise back to an input portion on the CDAC (Capacitor Digital to Analog Converter) side of each SARADC included in the column SARADC 140 described below. More specifically, it is only necessary for the noise detection circuit 130 to be of a structure which allows adjustment in gain and phase so as to attain an amplitude and phase that are the same as those of the noise of the pixel signal $V_{SL}$ so that the noise contained in $V_{SL}$ input to a comparator included in the SARADC can be cancelled.

Figure 3:
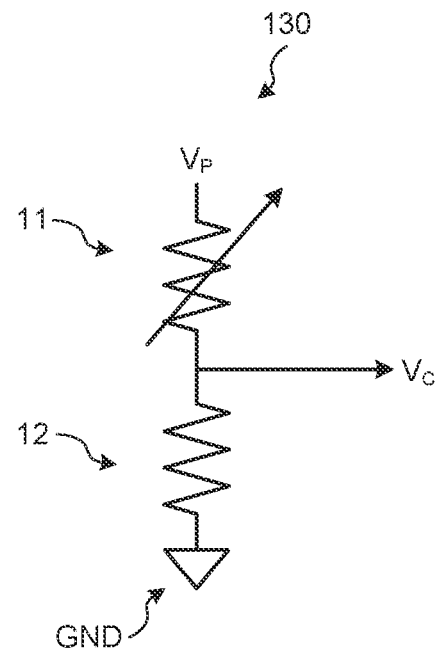
FIG. 3 is a circuit diagram illustrating an example of a noise detection circuit.
Figure 4:
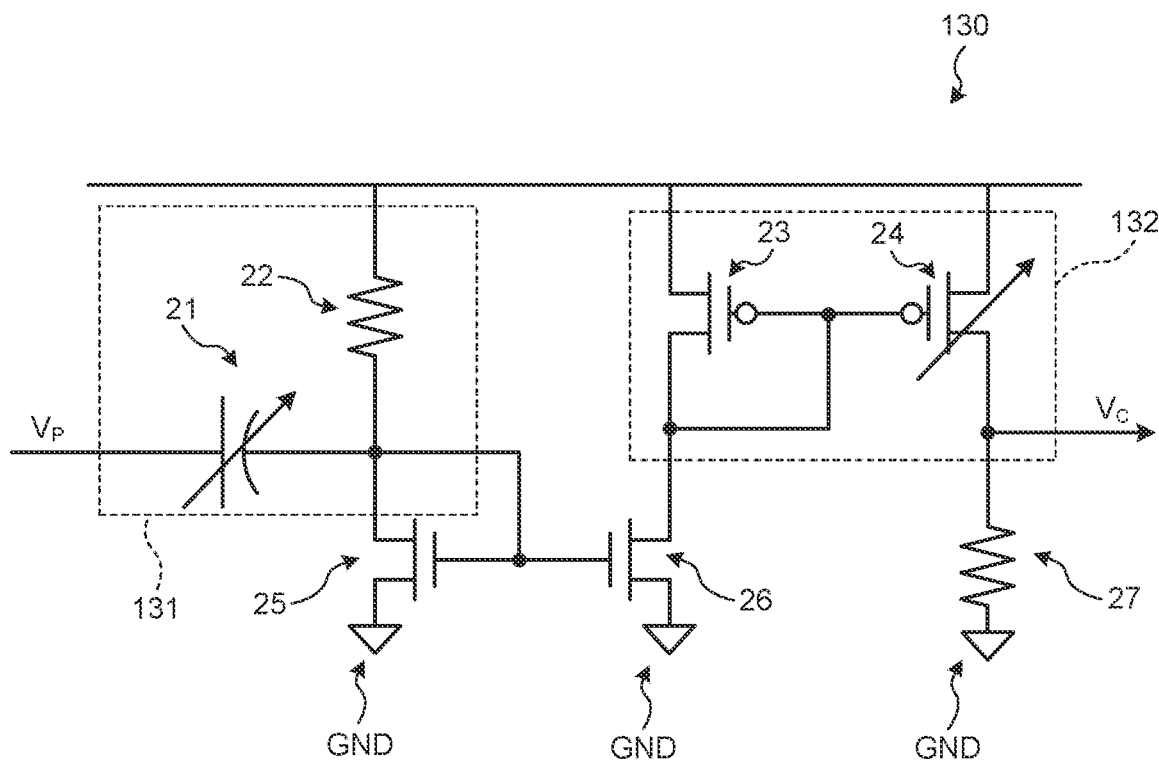
FIG. 4 is a circuit diagram illustrating an example of the noise detection circuit.

An example of the noise detection circuit 130 will be briefly described with reference to FIG. 3 and FIG. 4. FIG. 3 and FIG. 4 are circuit diagrams illustrating an example of the noise detection circuit 130.

As shown in FIG. 3, the noise detection circuit 130 is a resistance voltage division circuit including, for example, a variable resistance 11 and a resistance 12. In the noise detection circuit 130, the pixel power $V_P$ supplied to the pixel array portion 110 is supplied to the variable resistance 11. In this case, the larger the resistance value of the variable resistance 11, the smaller the output $V_C$ from the noise detection circuit 130. That is, through adjustment of a voltage division ratio, the noise detection circuit 130 can be adjusted to a desired gain.

As shown in FIG. 4, the noise detection circuit 130 may include, for example, a phase control portion 131 and a gain control portion 132. The phase control portion 131 is an RC circuit including, for example, a variable capacity 21 and a resistance 22. In this case, the phase control portion 131 controls the phase of a signal input to the variable capacity 21 in accordance with the capacity of the variable capacity 21. That is, by changing the capacity of the variable capacity 21, the phase control portion 131 can change the phase of the input signal to a desired phase. The input signal changed in phase is input to a MOSFET 26 (Metal Oxide Semiconductor Field Effect Transistor) by a MOSFET 25. The MOSFET 26 supplies the input signal changed in phase to the gain control portion 132. The gain control portion 132 includes an input side MOSFT 23 and an output side MOSFET 24. With this configuration, the gain control portion 132 controls the gain of the input signal. A voltage in accordance with a terminal resistance 27 is output from the noise detection circuit 130.

Figure 5:
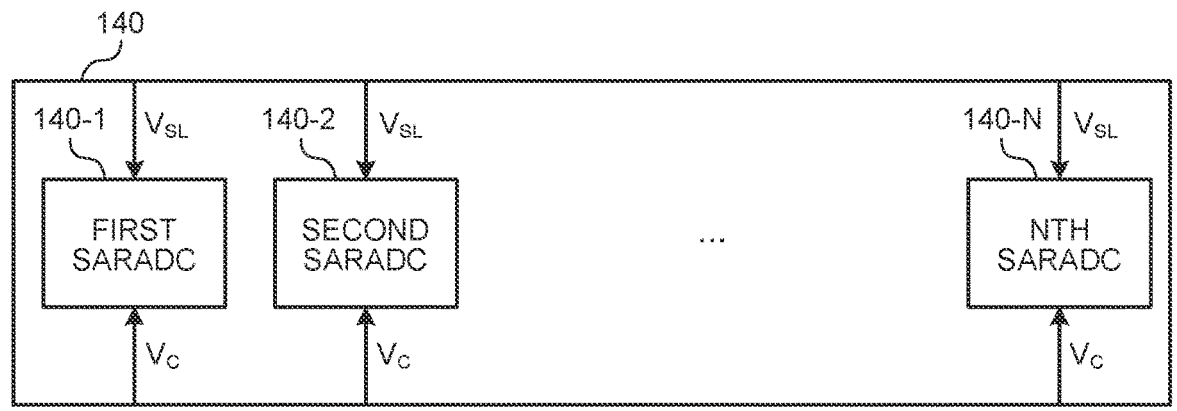
FIG. 5 is a schematic diagram illustrating an example of the structure of a column SARADC.

FIG. 1 will be referred to again. The column SARADC 140 AD (Analog to Digital) converts pixel signals received from a plurality of pixels and generates pixel data. As shown in FIG. 5, the column SARADC 140 has a first SARADC 140-1, a second SARADC 140-2, . . . , an Nth SARADC 140-N (N is an integer of 3 or larger). That is, the column SARADC 140 includes a plurality of SARADCs. As described more specifically below, a pixel signal $V_{SL}$ from a corresponding pixel of the pixel array portion 110 and the output $V_C$ from the noise detection circuit 130 are supplied to each SARADC. The first SARADC 140-1 through the Nth SARADC 140-N have the same structure. The specific structure of the first SARADC 140-1 through the Nth SARADC 140-N will be described below.

[1-2. Connection Relation Between Components]

Figure 6:
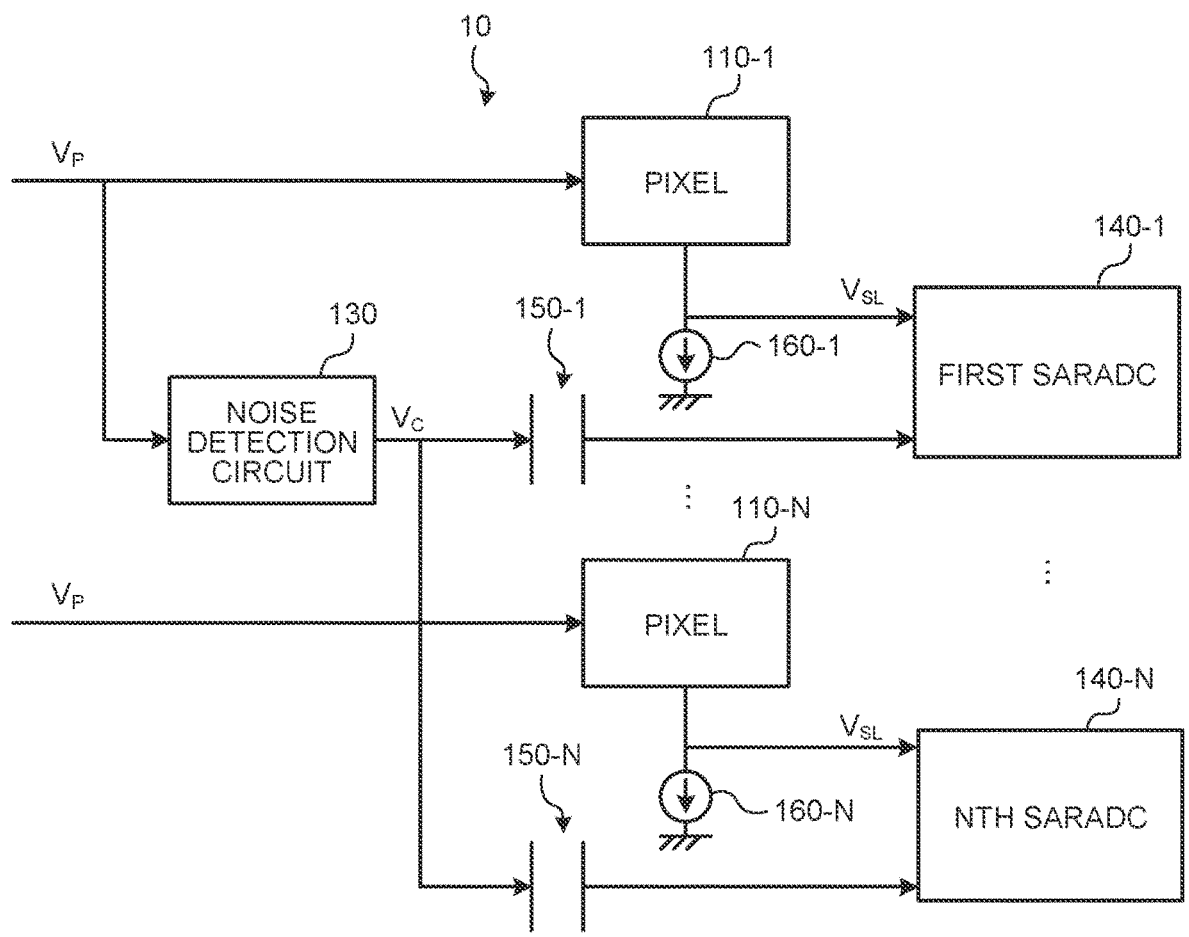
FIG. 6 is a schematic diagram illustrating an example of the structure of an analog-digital conversion circuit according to the first embodiment of the present disclosure.

The connection relation of components of the solid state imaging element 100 with respect to each column will be described with reference to FIG. 6. FIG. 6 is a schematic diagram illustrating the connection relation of components of an analog-digital conversion circuit 10 with respect to each column.

As shown in FIG. 6, the analog-digital conversion circuit 10 has a structure in which the first SARADC 140-1 through the Nth SARADC 140-N are respectively connected to a pixel 110-1 through a pixel 110-N of a corresponding row of the pixel array portion 110. In this case, analog pixel signals $V_{SL}$ are supplied from the pixel 110-1 through the pixel 110-N respectively to the first SARADC 140-1 through the Nth SARADC 140-N. Then, each of the first SARADC 140-1 through the Nth SARADC 140-N converts the supplied analog pixel signal $V_{SL}$ to a digital code.

Furthermore, the first SARADC 140-1 through the Nth SARADC 140-N are connected to the noise detection circuit 130 via a first separation element through an Nth separation element 150-N, respectively. In this case, the output $V_C$ from the noise detection circuit 130 is supplied to the first SARADC 140-1 through the Nth SARADC 140-N via a first separation element 150-1 through the Nth separation element 150-N, respectively.

Furthermore, a first current source 160-1 through an Nth current source 160-N are respectively connected to the first SARADC 140-1 through the Nth SARADC 140-N. Each of the first current source 160-1 through the Nth current source 160-N is a load current source for voltage-converting the current output from the pixel circuit, and the pixel signal $V_{SL}$ is supplied to each SARADC as the voltage output.

[1-3. Structure of the SARADC]

Figure 7:
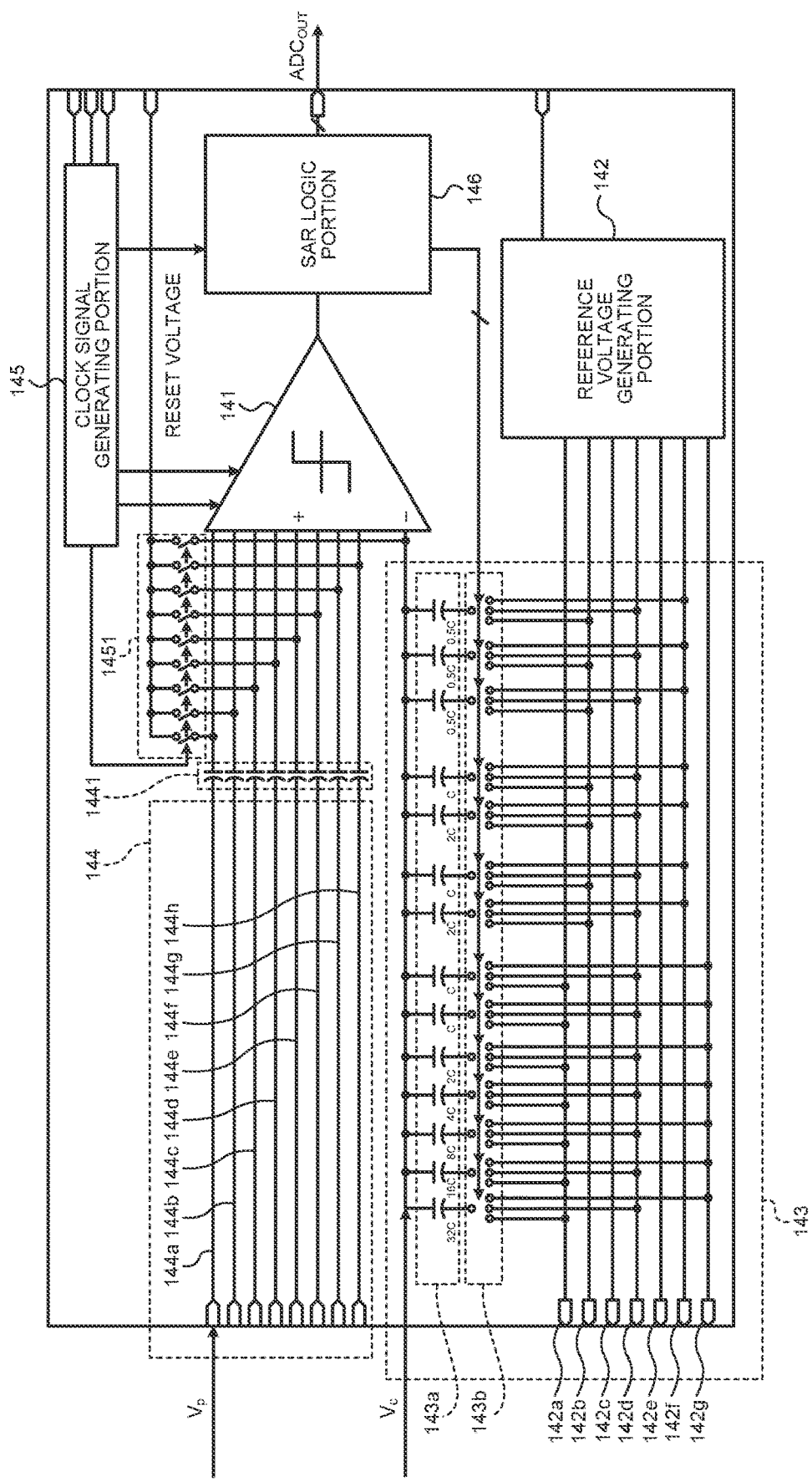
FIG. 7 is a schematic diagram illustrating an example of the structure of an SARADC.

The specific structure of the SARADC will be described with reference to FIG. 7. FIG. 7 is a schematic diagram illustrating the structure of the first SARADC 140-1. The structure of the second SARADC 140-2 through the Nth SARADC 140-N is the same as that of the first SARADC 140-1, and thus a description thereof will be omitted.

As shown in FIG. 7, the first SARADC 140-1 includes a comparator 141, a reference voltage generating portion 142, a digital-analog conversion portion 143, an analog signal input portion 144, a clock signal generating portion 145, and an SAR logic portion 146.

With the clock timing from the clock signal generating portion 145, the comparator 141 compares the output voltage of the digital-analog conversion portion 143 with the analog signal input from the analog signal input portion 144, and outputs the comparison result to the SAR logic portion 146.

The reference voltage generating portion 142 outputs a reference voltage to the digital-analog conversion portion 143. More specifically, the reference voltage generating portion 142 has first reference wiring 142a, second reference wiring 142b, third reference wiring 142c, fourth reference wiring 142d, fifth reference wiring 142e, sixth reference wiring 142f, and seventh reference wiring 142g. Reference voltages of different values are applied to the first reference wiring 142a through the seventh reference wiring 142g. That is, the reference voltage generating portion 142 outputs seven kinds of reference voltage to the digital-analog conversion portion 143. Note that FIG. 7 is only given by way of example, and the number of the kinds of reference voltage the reference voltage generating portion 142 outputs to the digital-analog conversion portion 143 is not restricted to seven.

The digital-analog conversion portion 143 generates an analog signal based on the reference voltage, and supplies it to the comparator 141. More specifically, the digital-analog conversion portion 143 is a CDAC having a capacity portion 143a and a switch portion 143b. As specifically described below, the signal $V_C$ from the noise detection circuit is input to the digital-analog conversion portion 143.

The capacity portion 143a includes a plurality of capacitor elements. In FIG. 7, the capacity C of each capacitor is given in terms of ratio. The switch portion 143b includes a plurality of switch elements. The switch elements are connected to corresponding capacitor elements. Each of the switch elements has three wirings each connected to one of the first reference wiring 142a through the seventh reference wiring 142g in a switchable manner.

That is, the digital-analog conversion portion 143 is a binary type CDAC supplying to the comparator 141 an analog signal of a value differing depending on the combination of the value of the capacity of the capacitor element and the value of the reference voltage.

The analog signal input portion 144 is connected to the pixels of the pixel array portion, and supplies pixel signals output from the pixels to the comparator 141. More specifically, the analog signal input portion 144 has first input wiring 144a, second input wiring 144b, third input wiring 144c, fourth input wiring 144d, fifth input wiring 144e, sixth input wiring 144f, seventh input wiring 144g, and eighth input wiring 144h. In this case, in accordance with the pixel, the pixel signal is input to one of the first input wiring 144a through the eighth input wiring 144h. While FIG. 7 shows eight wirings to which the pixel signal is to be input, this is only given by way of example, and the number of input wirings may be, for example, one.

Each of the first input wiring 144a through the eighth input wiring 144h is provided with a maintaining portion 1441. The maintaining portion 1441 includes a capacitor element provided in each input wiring. The maintaining portion 1441 is used to maintain a reset voltage described below, and DC-potential-convert the input signal from the input portion to secure the operating point for the comparator 141.

The clock signal generating portion 145 outputs a clock signal determining operational timing to the comparator 141 and the SAR logic portion 146. In this case, the comparator 141 and the SAR logic portion 146 operate in accordance with the clock signal output by the clock signal generating portion 145. The clock signal generating portion 145 controls the opening and closing of a switch portion 1451 provided in the wiring through which the reset voltage is supplied to the first input wiring 144a through the eighth input wiring 144h. The clock signal generating portion 145 switches the opening and closing of the switch portion 1451, whereby the reset voltage is supplied to the first input wiring 144a through the eighth input wiring 144h, and the electric charge accumulated in the maintaining portion 1441 is reset.

The SAR logic portion 146 controls the digital-analog conversion portion 143 such that the voltage of the pixel signal input from the pixel and the output voltage from the digital-analog conversion portion 143 approximate each other for each bit in AD conversion based on the comparison result of the comparator 141. More specifically, the SAR logic portion 146 outputs a feedback signal to the switch portion 143b to control the opening/closing of the switch portion 143b, thereby controlling the output voltage of the digital-analog conversion portion 143. These controls are executed for all the bits in the AD conversion, and the result is output to the outside as a digital signal $ADC_{OUT}$.

[1-4. Structure of Analog-Digital Conversion Circuit According to First Embodiment]

Figure 8:
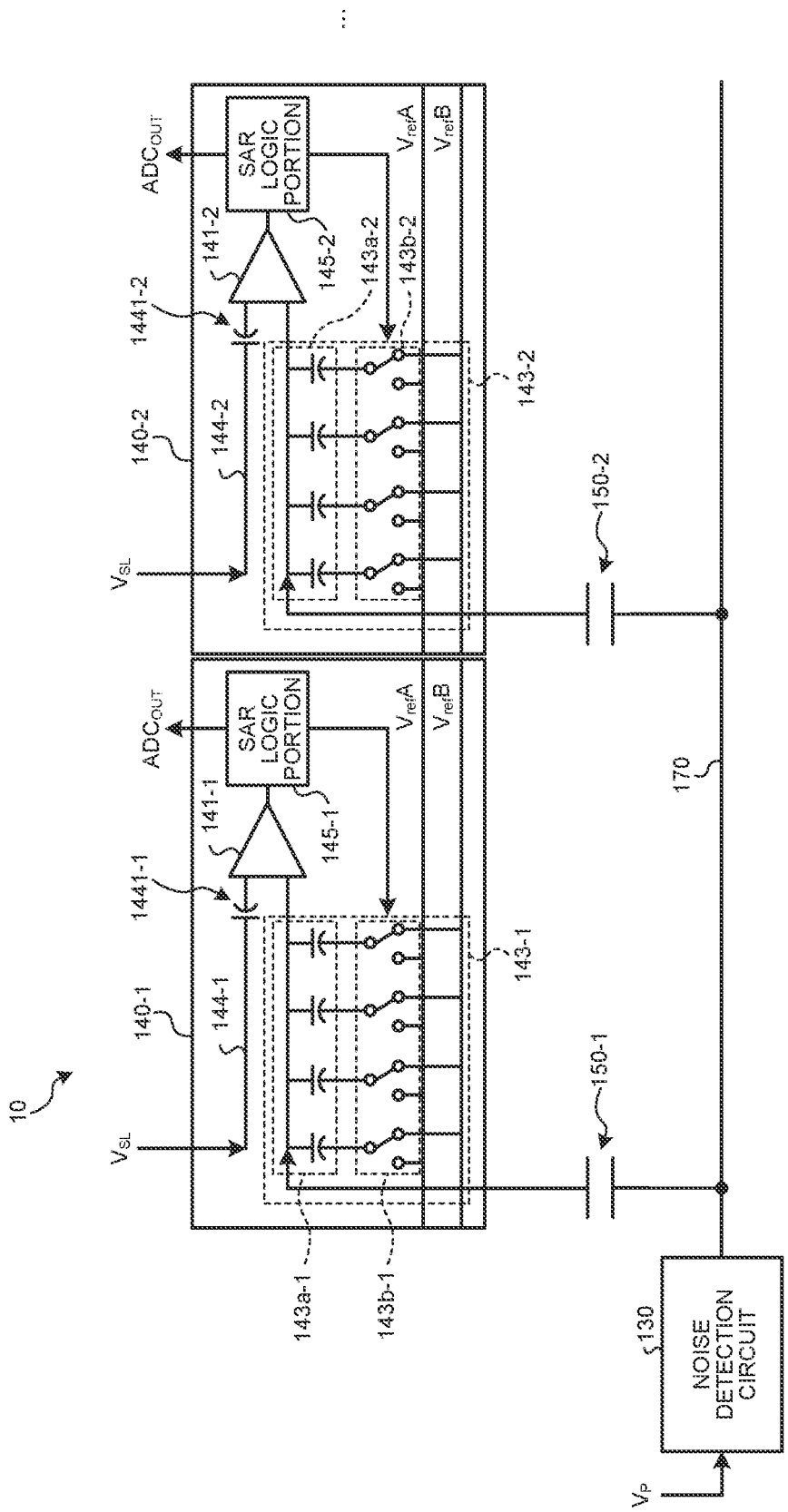
FIG. 8 is a schematic diagram illustrating an example of the structure of the analog-digital conversion circuit according to the first embodiment of the present disclosure.

The structure of an analog-digital conversion circuit will be described with reference to FIG. 8. FIG. 8 is a schematic diagram illustrating the structure of the analog-digital conversion circuit. In FIG. 8, the structure of the SARADC not directly related to the present disclosure is shown in a simplified fashion.

FIG. 8 illustrates the connection relation between the noise detection circuit 130, the first SARADC 140-1, and the second SARADC 140-2 in the analog-digital conversion circuit 10.

The first SARADC 140-1 includes a comparator 141-1, a digital-analog conversion portion 143-1, an analog signal input portion 144-1, and an SAR logic portion 145-1. In the case of FIG. 8, the pixel signal $V_{SL}$ is input to the analog signal input portion 144-1. Two reference voltages, a reference voltage $V_{ref}A$ and a reference voltage $V_{ref}B$, are input to the digital-analog conversion portion 143-1. The analog signal input portion 144-1 is provided with a maintaining portion 1441-1. The digital-analog conversion portion 143-1 includes a capacity portion 143a-1 and a switch portion 143b-1. Input to the comparator 141-1 are the pixel signal $V_{SL}$ and the output from the digital-analog conversion portion 143-1.

The second SARADC 140-2 includes a comparator 141-2, a digital-analog conversion portion 143-2, an analog signal input portion 144-2, and an SAR logic portion 145-2. In the case of FIG. 8, the pixel signal $V_{SL}$ is input to the analog signal input portion 144-2. Two reference voltages, the reference voltage $V_{ref}A$ and the reference voltage $V_{ref}B$, are input to the digital-analog conversion portion 143-2. The analog signal input portion 144-2 is provided with a maintaining portion 1441-2. The digital-analog conversion portion 143-2 includes a capacity portion 143a-2 and a switch portion 143b-2. Input to the comparator 141-2 are the pixel signal $V_{SL}$ and the output from the digital-analog conversion portion 143-2.

The values of the pixel signals $V_{SL}$ supplied to the comparator 141-1 and the comparator 141-2 are normally different from each other. Thus, the voltage that the digital-analog conversion portion 143-1 supplies to the comparator 141-1 and the voltage that the digital-analog conversion portion 143-2 supplies to the comparator 141-2 are of different values.

As described above, the first SARADC 140-1 and the second SARADC 140-2 are SARADCs of columns included in the column SARADC 140. That is, in the present disclosure, the digital-analog conversion portion is provided for each column.

The noise detection circuit 130 is connected to the digital-analog conversion portion 143-1 and the digital-analog conversion portion 143-2 by correction signal input wiring 170. A first separation element 150-1 is arranged between the noise detection circuit 130 and the digital-analog conversion portion 143-1, a second separation element 150-2 is arranged between the noise detection circuit 130 and the digital-analog conversion portion 143-2. For example, the first separation element 150-1 and the second separation element 150-2 are capacitor elements. The noise detection circuit 130 feeds the detection result of the noise contained in pixel power $V_P$ supplied to the pixel array portion 110 back to the digital-analog conversion portion 143-1 via the first separation element 150-1. More specifically, the noise detection circuit 130 adjusts the gain and phase such that the noise contained in the pixel power $V_P$ attains the same amplitude and phase as those of the component appearing in the pixel signal $V_{SL}$ through the pixel circuit, and feed them back to the digital-analog conversion portion 143-1 via the first separation element 150-1. As a result, a noise correction voltage is input to the comparator 141-1 along with the output voltage of the digital-analog conversion portion 143-1, so that it is possible to cancel the influence of the noise contained in the pixel signal $V_{SL}$ at the time of comparison at the comparator 141-1. Regarding the relation between the noise detection circuit 130 and the digital-analog conversion portion 143-2, it is the same as the relation between the noise detection circuit 130 and the digital-analog conversion portion 143-1, and a description thereof will be omitted.

The correction signal input wiring 170 connects the noise detection circuit 130, the first SARADC 140-1, and the second SARADC 140-2. That is, common wiring is used to input the noise detection result of the pixel power $V_P$ to the digital-analog conversion portion of each column SARADC. As a result, the output from the digital-analog conversion portion 143-1 and the output from the digital-analog conversion portion 143-2 may interfere with each other.

In the present disclosure, the first separation element 150-1 is arranged between the noise detection circuit 130 and the digital-analog conversion portion 143-1. Furthermore, the second separation element 150-2 is arranged between the noise detection circuit 130 and the digital-analog conversion portion 143-2. Thus, the first separation element 150-1 interrupts the output from the digital-analog conversion portion 143-1 to the correction signal input wiring 170. The second separation element 150-2 interrupts the output from the digital-analog conversion portion 143-2 to the correction signal input wiring 170. That is, the first separation element 150-1 and the second separation element 150-2 prevent interference between the output from the digital-analog conversion portion 143-1 and the output from the digital-analog conversion portion 143-2. In other words, the first separation element 150-1 electrically separates the digital-analog conversion portion 143-1 from the correction signal input wiring 170, and the second separation element 150-2 electrically separates the digital-analog conversion portion 143-2 from the correction signal input wiring 170. In the present disclosure, a separation element is provided for each SARADC of the column SARADC 140. Thus, it is possible to prevent interference between the outputs from the digital-analog conversion portions of the SARADCs.

For example, the first separation element 150-1 and the second separation element 150-2 may be variable capacities. In this case, the capacity of the first separation element 150-1 is changed in accordance with the capacity of the digital-analog conversion portion 143-1, whereby it is possible to adjust the gain of the signal fed back to the digital-analog conversion portion 143-1 from the noise detection circuit 130. Regarding the second separation element 150-2, it is the same as the first separation element 150-1, and a description thereof will be omitted.

As described above, in the present disclosure, to correct the influence of the noise of the signal supplied to the pixel array portion 110, there is no need to mount a dummy pixel or a correction logic for removing noise, so that it is possible to correct the influence of noise without involving an increase in area.

(2. Second Embodiment)

[2-1. Structure of Analog-Digital Conversion Circuit According to Second Embodiment]

Figure 9:
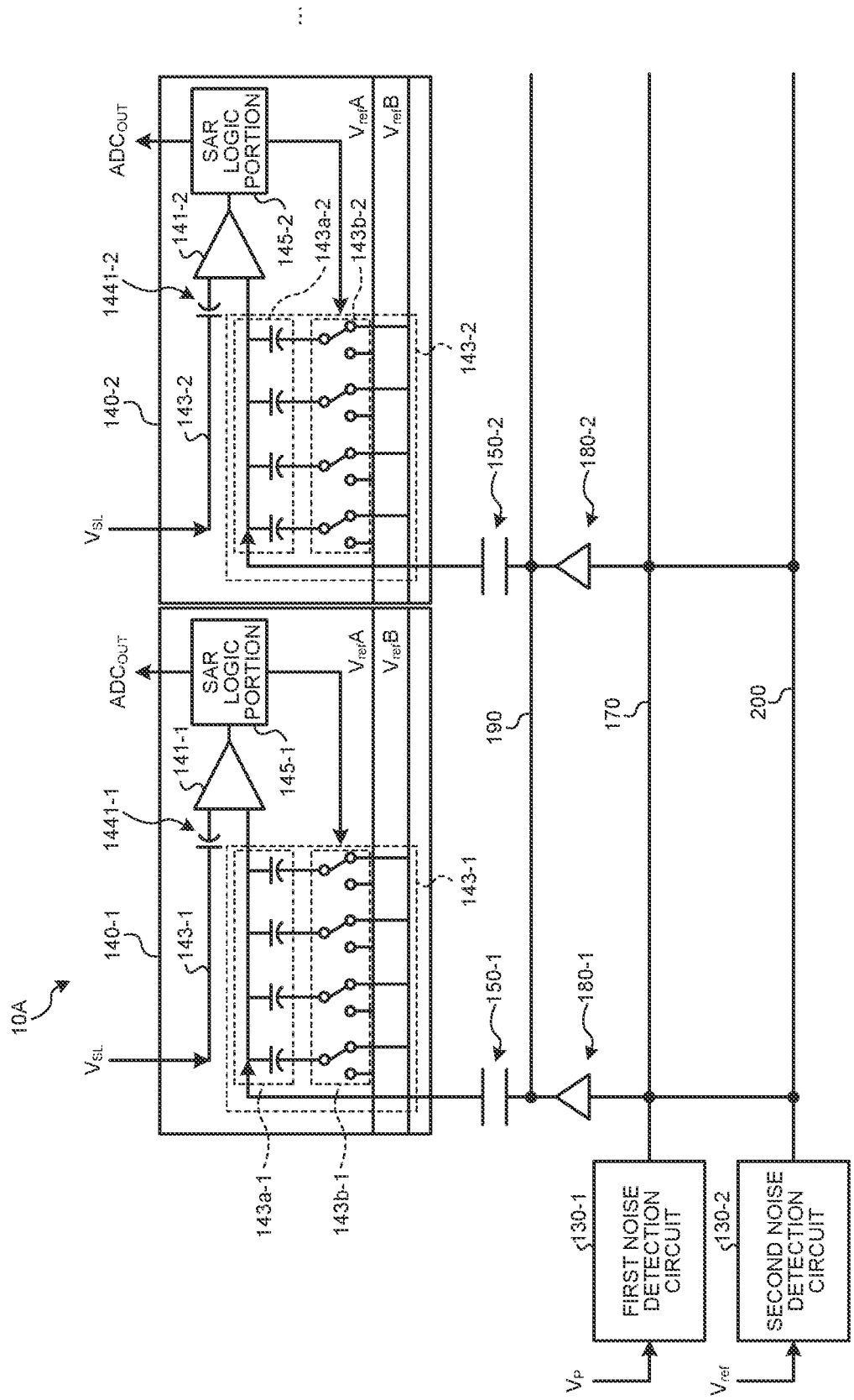
FIG. 9 is a schematic diagram illustrating an example of the structure of an analog-digital conversion circuit according to a second embodiment of the present disclosure.

The second embodiment of the present disclosure will be described with reference to FIG. 9. FIG. 9 is a schematic diagram illustrating the structure of the analog-digital conversion circuit according to the second embodiment of the present disclosure.

A first noise detection circuit 130-1 detects noise contained in the pixel power $V_P$ supplied to the pixel array portion 110. The first noise detection circuit 130-1 feeds the noise detection result back to the digital-analog conversion portion 143-1 and the digital-analog conversion portion 143-2 respectively via the first separation element 150-1 and the second separation element 150-2.

A second noise detection circuit 130-2 detects noise contained in the power other than the pixel power $V_P$ supplied to the pixel array portion 110, and feeds the detection result back to the digital-analog conversion portion 143-1 and the digital-analog conversion portion 143-2. The power other than the pixel power $V_P$ means, for example, the reference voltage of the first SARADC 140-1 and the second SARADC 140-2. The second noise detection circuit 130-2, the digital-analog conversion portion 143-1, and the digital-analog conversion portion 143-2 are connected by heterogeneous power correction signal input wiring 200. That is, the second noise detection circuit 130-2, the digital-analog conversion portion 143-1, and the digital-analog conversion portion 143-2 are connected by common wiring. By using common wiring for the output from the second noise detection circuit 130-2, there is no need to provide the separation elements 150-1 and 150-2 for each noise detection circuit, making it possible to achieve a reduction in area and in gain loss of the digital-analog conversion portion.

A first amplifier 180-1 may be arranged between the first noise detection circuit 130-1, the second noise detection circuit 130-2, and the first separation element 150-1. Similarly, a second amplifier 180-2 may be arranged between the first noise detection circuit 130-1, the second noise detection circuit 130-2, and the second separation element 150-2.

The first amplifier 180-1 and the second amplifier 180-2 are amplifiers that are of lower output impedance than the first noise detection circuit 130-1 and the second noise detection circuit 130-2. By arranging an amplifier of low output impedance in a feedback route from each noise detection circuit to a corresponding digital-analog conversion portion, it is possible to suppress coupling of the output from the digital-analog conversion portions between columns by way of the separation elements.

Figure 10:
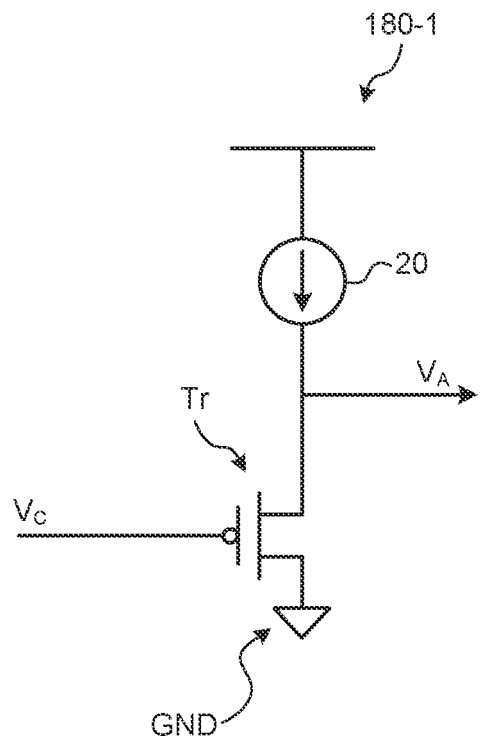
FIG. 10 is a circuit diagram illustrating an example of the structure of an amplifier.
Figure 11:
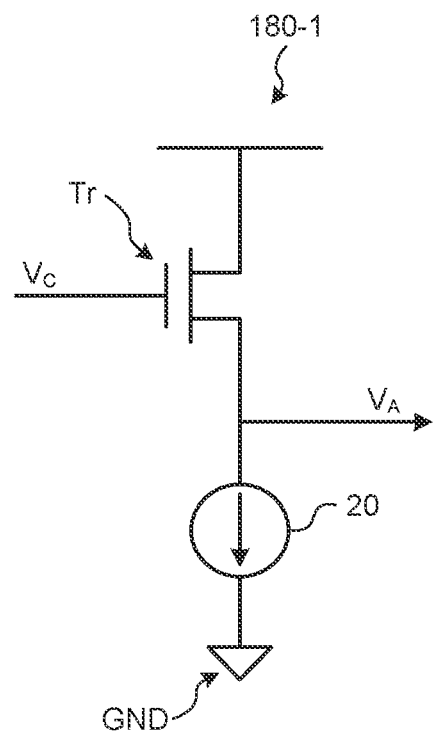
FIG. 11 is a circuit diagram illustrating an example of the structure of the amplifier.

The first amplifier 180-1 and the second amplifier 180-2 can be implemented in the form, for example, of a source follower circuit including a pMOS transistor Tr and a current source as shown in FIG. 10, or a source follower circuit including an nMOS transistor Tr and a current source as shown in FIG. 11.

FIG. 9 will be referred to again. The output destinations of the first amplifier 180-1 and the second amplifier 180-2 may be connected by amplifier output connection wiring 190. By connecting the first amplifier 180-1 and the second amplifier 180-2, the first amplifier 180-1 and the second amplifier 180-2 are arranged in parallel with each other, making it possible to reduce the noise emitted from the amplifiers. Furthermore, the input and output terminals of the first amplifier 180-1 and the second amplifier 180-2 are connected to each other by the correction signal input wiring 170 and the amplifier output connection wiring 190. Thus, the first amplifier 180-1 and the second amplifier 180-2 can be shared by the columns. As a result, there is no need to provide an amplifier for each column, so that by making the number of amplifiers smaller than the number of columns, it is possible to reduce the area of an analog-digital conversion circuit 10A.

(3. Indirect ToF Type Image Sensor)

Figure 12:
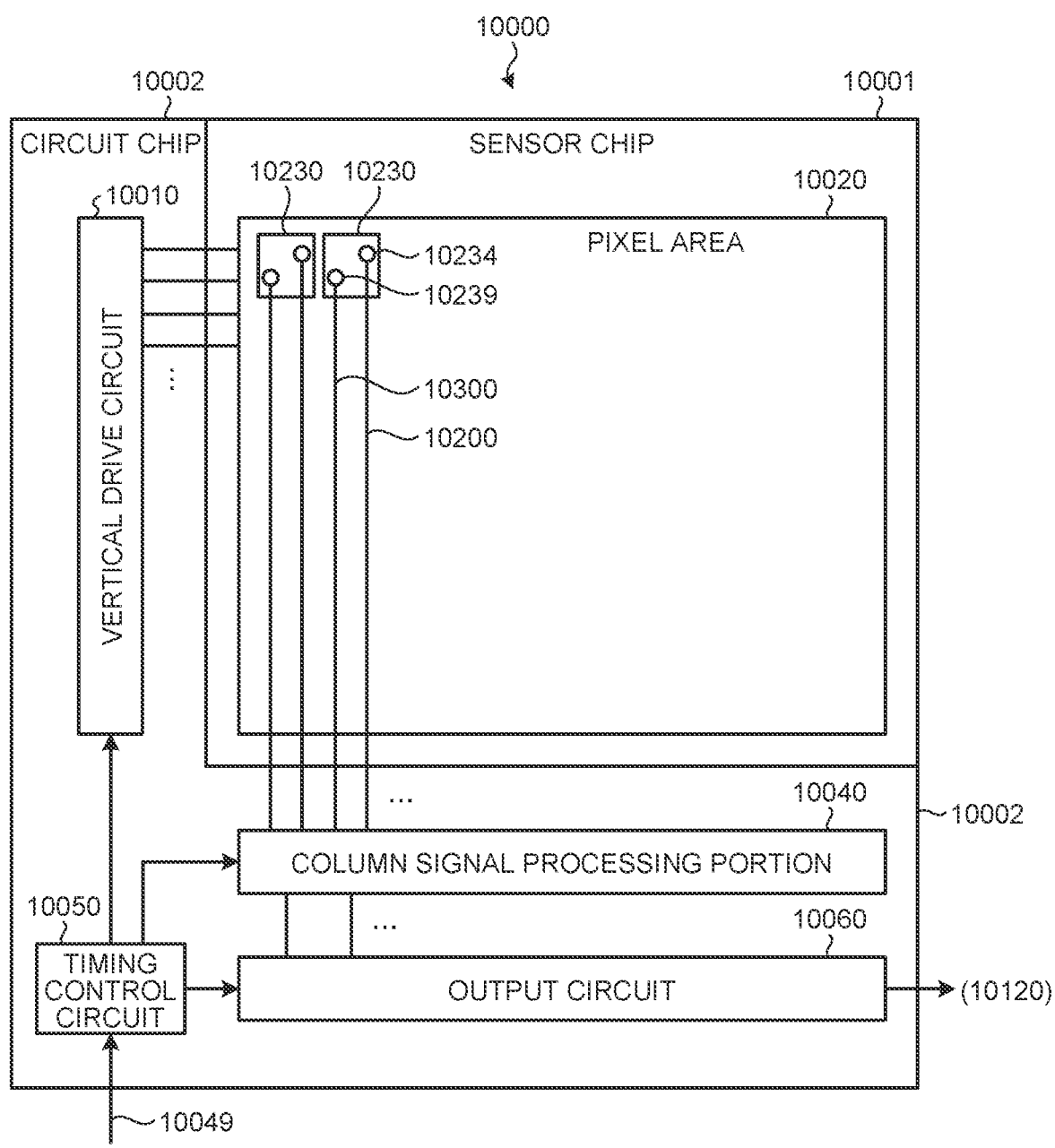
FIG. 12 is a block diagram illustrating an example of the structure of an indirect ToF type image sensor to which an analog-digital conversion circuit according to the present disclosure is applied.

Next, the structure of an indirect ToF (Indirect-Time of Flight) type image sensor to which the analog-digital conversion circuit according to the present disclosure is applied will be described with reference to FIG. 12. FIG. 12 is a block diagram illustrating an example of the structure of an indirect ToF type image sensor to which the analog-digital conversion circuit according to the present disclosure is applied.

The indirect ToF system is a technique that applies a light source beam (e.g., a laser beam in the infrared range) modulated, for example, by PWM (Pulse Width Modulation) to an object of measurement and receives the reflection hereof by a light receiving element to measure the distance to the object of measurement based on the difference in phase between the received reflection and the light source beam. In the indirect ToF system, distance measurement is performed, for example, based on the ratio of the sum total of the light source beam reflection receiving time in an ON period in the PWM of the light source beam and that in an OFF period immediately after the ON period to the reflection receiving time in the OFF period.

[3-1. Structure of Indirect ToF Type Image Sensor]

FIG. 12 is a block diagram illustrating an example of an indirect ToF type image sensor 10000 to which an embodiment of the present technique is applied. The indirect ToF type image sensor 10000 includes a sensor chip 10001 and a circuit chip 10002 stacked on the sensor chip 10001.

A pixel area 10020 includes a plurality of pixels arranged in an array-like fashion in a two-dimensional grid pattern on the sensor chip. The pixel area 10020 may be arranged in rows and columns, and may include a plurality of column signal lines. Each column signal line is connected to corresponding pixels. Furthermore, a vertical drive circuit 10010, a column signal processing portion 10040, a timing control circuit 10050, and an output circuit 10060 are arranged on the circuit chip 10002.

The vertical drive circuit 10010 is configured to drive the pixels and to output a pixel signal to the column signal processing portion 10040. The column signal processing portion 10040 executes analog-digital (AD) conversion processing on the pixel signal output from the pixels, and outputs an AD conversion-processed pixel signal to the output circuit. For example, the column signal processing portion 10040 is of a structure similar to that of the column SARADC 140 shown in FIG. 5. That is, the column signal processing portion 10040 includes, for example, a plurality of SARADCs. The output circuit 10060 executes CDS (Correlated Double Sampling) processing or the like on the data from the column signal processing portion 10040, and outputs the data to a signal processing circuit 10120 on the output side.

The timing control circuit 10050 is configured to control each drive timing of the vertical drive circuit 10010. The column signal processing portion 10040 and the output circuit 10060 are in synchronism with a vertical synchronization signal 10049.

In the pixel area 10020, a plurality of pixels are arranged in a two-dimensional grid pattern, and each pixel receives infrared rays, and allows photoelectric conversion to a pixel signal.

For each column of pixels 10230, vertical signal lines $VSL_1$ 10300 and $VSL_2$ 10200 are arranged. Assuming that the sum total of the columns in the pixel area 10020 is M (M is an integer), 2×M vertical signal lines are arranged in total. Each pixel has two taps. The vertical signal lines $VSL_1$ 10300 are connected to taps A 10239 (TAP_A in FIG. 13) of pixels 10230, and the vertical signal lines $VSL_2$ 10200 are connected to taps B 10234 (TAP_B in FIG. 13) of pixels 10230. The vertical signal lines $VSL_1$ 10300 transmit a pixel signal $AIN_{P1}$ and the vertical signal lines $VSL_2$ 10200 transmit a pixel signal $AIN_{P2}$.

The vertical drive circuit 10010 successively selects and drives the row of the pixels 10230, and, in that row, simultaneously causes each pixel 10230 to output the pixel signal $AIN_{P1}$ and the pixel signal $AIN_{P2}$. In other words, the vertical drive circuit 10010 simultaneously drives the 2kth row and the 2k+1th row of the pixels 10230.

Figure 13:
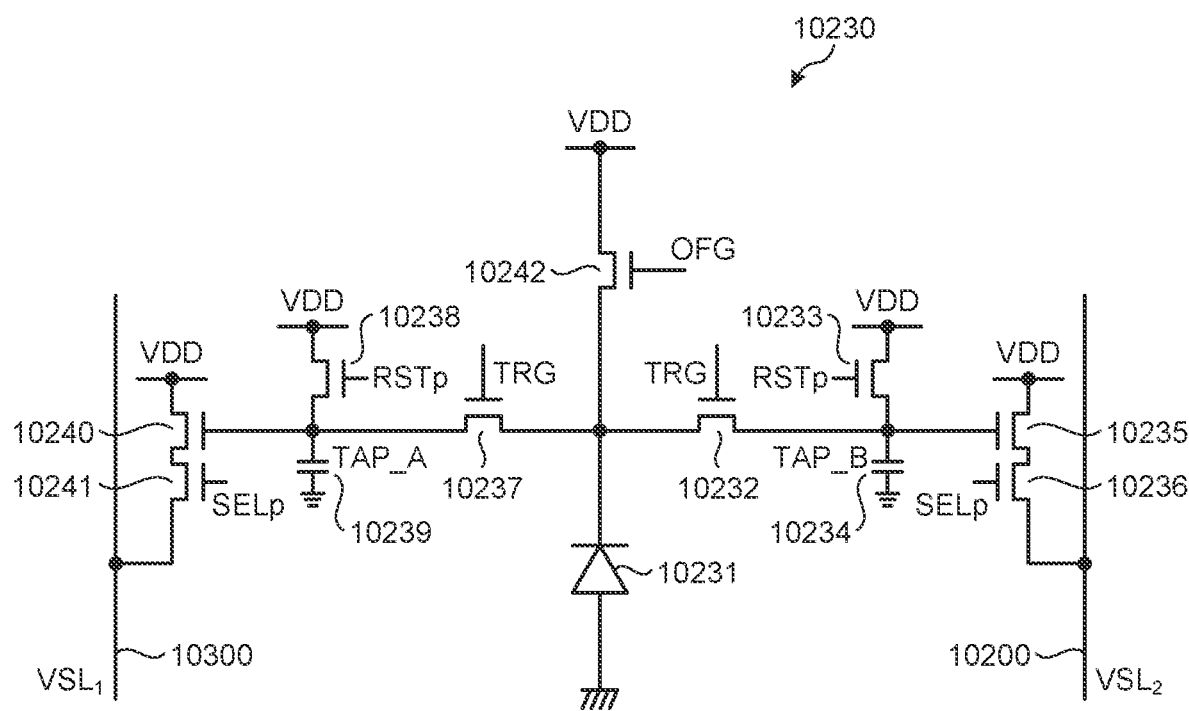
FIG. 13 is a circuit diagram illustrating an example of a pixel structure according to the present disclosure.

FIG. 13 is a circuit diagram illustrating an example of the structure of the pixel 10230 according to the present disclosure. The pixel 10230 includes a photo diode 10231, two transfer transistors 10232 and 10237, two reset transistors 10233 and 10238, two taps (floatation diffusion layers 10234 and 10239), two amplification transistors 10235 and 10240, and two selection transistors 10236 and 10241.

The photo diode 10231 generates electric charge through photoelectric conversion of received light. This photo diode 10231 is arranged on a back surface of a semiconductor substrate, which is the reverse surface with respect to a front surface of the semiconductor substrate on which circuits are arranged. This solid state imaging element is referred to as a back surface irradiation type solid state imaging element. Instead of the back surface irradiation type solid state imaging element, it is also possible to adopt a front surface irradiation type structure in which the photo diode 10231 is arranged on the front surface.

The transfer transistor 10232 transfers charge from the photo diode 10231 sequentially to the tap A 10239 and the tap B 10234, respectively, in accordance with a transfer signal TRG from the vertical drive circuit 10010.

The tap A 10239 and the tap B 10234 accumulate the transmitted charge, and generate a voltage in accordance with the amount of the accumulated charge.

An overflow transistor 10242 is a transistor discharging the charge of the photo diode 10231 sequentially to a VDD, and has a function to reset the photo diode.

The reset transistors 10233 and 10238 draw charge respectively from the tap A 10239 and the tap B 10234 in accordance with a reset signal RSTp from the vertical drive circuit 10010, and initialize the charge amount. The amplification transistors 10235 and 10240 respectively amplify the voltages of the tap A 10239 and the tap B 10234. The selection transistors 10236 and 10241 output the amplified voltage signals to the column signal processing portion 10040 as pixel signals via two vertical signal lines (e.g., $VSL_1$ 10300 and $VSL_2$ 10200) in accordance with a selection signal SELp from the vertical drive circuit 10010. The vertical signal lines $VSL_1$ 10300 and $VSL_2$ 10200 are connected to the input side of one analog-digital converter of a plurality of analog-digital converters contained in the column signal processing portion 10040.

The circuit structure of the pixel 10230 is not limited to the structure illustrated in FIG. 13 so long as it is possible to generate the pixel signals $AIN_{P1}$ and $AIN_{P2}$ by photoelectric conversion.

The advantageous effect as mentioned in the present specification is given simply as an example, and should not be construed restrictively. Some other effect may also be achieved.

The present technique may also adopt the following structures.

(1)
A solid state imaging element including:
a successive approximation type analog-digital conversion circuit converting an analog pixel signal received from a pixel of a pixel array portion to a digital code; and
a first noise detection circuit connected to a DAC (Digital to Analog Converter) output node inside the successive approximation type analog-digital conversion circuit and detecting power noise supplied to the pixel of the pixel array portion to output a detection result to the DAC.

(2)
The solid state imaging element according to (1), further including a plurality of the successive approximation type analog-digital conversion circuits, wherein
the first noise detection circuit is connected to the successive approximation type analog-digital conversion circuits, and
a separation element is provided between the first noise detection circuit and each of the successive approximation type analog-digital conversion circuits.

(3)
The solid state imaging element according to (2), wherein
the separation element is a capacity element.

(4)
The solid state imaging element according to (2) or (3), wherein
the separation element is a variable capacity element.

(5)
The solid state imaging element according to any one of (1) to (4), wherein
the first noise detection circuit controls at least one of phase and gain of a voltage supplied to the pixel.

(6)
The solid state imaging element according to any one of (1) to (5), further including:
a second noise detection circuit connected to the successive approximation type analog-digital conversion circuits and detecting noise of a voltage supplied to the DAC output node inside the successive approximation type analog-digital conversion circuits and different from the voltage supplied to the pixel, wherein the separation element is provided between the second noise detection circuit and each of the successive approximation type analog-digital conversion circuits.

(7)
The solid state imaging element according to (6), wherein
the second noise detection circuit detects noise of a reference voltage supplied to the DAC inside the successive approximation type analog-digital conversion circuit.

(8)
The solid state imaging element according to (6) or (7), wherein
an amplifier is provided at a midpoint of a route connecting the first noise detection circuit, the second noise detection circuit, and the separation element.

(9) The solid state imaging element according to any one of (6) to (8), wherein
in at least one route connecting the second noise detection circuit and the output node of the DAC inside each of the successive approximation type analog-digital conversion circuits, an amplifier is provided on an input side of the separation element; and
in a route connecting the first noise detection circuit, the second noise detection circuit, and an output of the DAC of each of the successive approximation type analog-digital conversion circuits, an output destination of the amplifier is connected.

(10)
The solid state imaging element according to (8) or (9), wherein
the amplifier is a source follower circuit.

(11)
An electronic apparatus including:
a successive approximation type analog-digital conversion circuit converting an analog pixel signal received from a pixel of a pixel array portion to a digital code; and
a first noise detection circuit connected to a DAC (Digital to Analog Converter) output node of the successive approximation type analog-digital conversion circuit and detecting power noise supplied to the pixel of the pixel array portion to output a detection result to the DAC.

(12)
The electronic apparatus according to (11), wherein
the electronic apparatus is an indirect ToF type image sensor.

13. A power noise correction method including detecting power noise supplied to a pixel of a pixel array portion and outputting a detection result to a successive approximation type analog-digital conversion circuit, the successive approximation type analog-digital conversion circuit converting an analog pixel signal received from the pixel of the pixel array portion to a digital code.

REFERENCE SIGNS LIST

10, 10A analog-digital conversion circuit
100 solid state imaging element
110 pixel array portion
120 driver
130 noise detection circuit
130-1 first noise detection circuit
130-2 second noise detection circuit
140 column SARADC
140-1 first SARADC
140-2 second SARADC 141 comparator
142 reference voltage generating portion
143 digital-analog conversion portion
144 analog signal input portion
150-1 first separation element
150-2 second separation element
160-1 first current source
170 correction signal input wiring
180-1 first amplifier
180-2 second amplifier
190 amplifier output connection wiring
200 heterogeneous power correction signal input wiring
10000 indirect ToF type image sensor
10001 sensor chip
10002 circuit chip
10010 vertical drive circuit
10020 pixel area
10040 column signal processing portion
10050 timing control circuit
10060 output circuit
10231 photo diode
10232, 10237 transfer transistor
10233, 10238 reset transistor
10234 tap B (floatation diffusion layer)
10235, 10240 amplification transistor
10236, 10241 selection transistor
10239 tap A (floatation diffusion layer)

The invention claimed is:

1. A solid state imaging element comprising:
a plurality of successive approximation type analog-digital conversion circuits respectively configured to convert an analog pixel signal received from a pixel of a pixel array portion to a digital code;
a first noise detection circuit connected to a DAC (Digital to Analog Converter) output node inside the successive approximation type analog-digital conversion circuit, the first noise detection circuit receiving a power supply voltage that is supplied to the pixel, and detecting noise in the power supply voltage that is supplied to the pixel to output a detection result to the DAC, wherein the first noise detection circuit is connected to the successive approximation type analog-digital conversion circuits, and a separation element is provided between the first noise detection circuit and each of the successive approximation type analog-digital conversion circuits; and
a second noise detection circuit connected to the successive approximation type analog-digital conversion circuits and detecting noise of a voltage supplied to the DAC output node inside the successive approximation type analog-digital conversion circuits and different from the power supply voltage supplied to the pixel, wherein
the separation element is provided between the second noise detection circuit and each of the successive approximation type analog-digital conversion circuits.

2. The solid state imaging element according to claim 1, wherein the separation element is a capacity element.

3. The solid state imaging element according to claim 1, wherein the separation element is a variable capacity element.

4. The solid state imaging element according to claim 1, wherein the first noise detection circuit controls at least one of phase and gain of the power supply voltage supplied to the pixel.

5. The solid state imaging element according to claim 1, wherein the second noise detection circuit detects noise of a reference voltage supplied to the DAC inside the successive approximation type analog-digital conversion circuit.

6. The solid state imaging element according to claim 1, wherein an amplifier is provided at a midpoint of a route connecting the first noise detection circuit, the second noise detection circuit, and the separation element.

7. The solid state imaging element according to claim 1, wherein
in at least one route connecting the second noise detection circuit and the output node of the DAC inside each of the successive approximation type analog-digital conversion circuits, an amplifier is provided on an input side of the separation element; and
in a route connecting the first noise detection circuit, the second noise detection circuit, and an output of the DAC of each of the successive approximation type analog-digital conversion circuits, an output destination of the amplifier is connected.

8. The solid state imaging element according to claim 7, wherein the amplifier is a source follower circuit.

9. An electronic apparatus comprising:
a plurality of successive approximation type analog-digital conversion circuits respectively configured to convert an analog pixel signal received from a pixel of a pixel array portion to a digital code;
a first noise detection circuit connected to a DAC (Digital to Analog Converter) output node inside the successive approximation type analog-digital conversion circuit, the first noise detection circuit receiving a power supply voltage that is supplied to the pixel, and detecting noise in the power supply voltage that is supplied to the pixel to output a detection result to the DAC, wherein the first noise detection circuit is connected to the successive approximation type analog-digital conversion circuits, and a separation element is provided between the first noise detection circuit and each of the successive approximation type analog-digital conversion circuits; and
a second noise detection circuit connected to the successive approximation type analog-digital conversion circuits and detecting noise of a voltage supplied to the DAC output node inside the successive approximation type analog-digital conversion circuits and different from the power supply voltage supplied to the pixel, wherein
the separation element is provided between the second noise detection circuit and each of the successive approximation type analog-digital conversion circuits.

10. The electronic apparatus according to claim 9, wherein the electronic apparatus is an indirect ToF type image sensor.

11. The electronic apparatus according to claim 9, wherein the separation element is a capacity element.

12. The electronic apparatus according to claim 9, wherein the separation element is a variable capacity element.

13. The electronic apparatus according to claim 9, wherein the first noise detection circuit controls at least one of phase and gain of the power supply voltage supplied to the pixel.

14. The electronic apparatus according to claim 9, wherein the second noise detection circuit detects noise of a reference voltage supplied to the DAC inside the successive approximation type analog-digital conversion circuit.

15. The electronic apparatus according to claim 9, wherein an amplifier is provided at a midpoint of a route connecting the first noise detection circuit, the second noise detection circuit, and the separation element.

\* \* \* \* \*